US011445650B2

(12) United States Patent
Lewis et al.

(10) Patent No.: US 11,445,650 B2
(45) Date of Patent: Sep. 13, 2022

(54) LOCALIZED REWORK USING LIQUID MEDIA SOLDERING

(71) Applicant: International Business Machines Corporation, Armonk, NY (US)

(72) Inventors: Theron Lee Lewis, Rochester, MN (US); Jennifer I. Bennett, Rochester, MN (US); James D. Bielick, Pine Island, MN (US); David J. Braun, St. Charles, MN (US); John R. Dangler, Rochester, MN (US); Stephen Michael Hugo, Stewartville, MN (US); Timothy Jennings, Rochester, MN (US); Timothy P. Younger, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 437 days.

(21) Appl. No.: 16/659,701

(22) Filed: Oct. 22, 2019

(65) Prior Publication Data
US 2021/0120712 A1    Apr. 22, 2021

(51) Int. Cl.
*B23K 1/00* (2006.01)
*H05K 13/04* (2006.01)
*B23K 1/018* (2006.01)

(52) U.S. Cl.
CPC ........ *H05K 13/0465* (2013.01); *B23K 1/018* (2013.01); *H05K 13/0486* (2013.01);
(Continued)

(58) Field of Classification Search
CPC ........... H05K 13/0465; H05K 13/0486; H05K 2203/0338; H05K 2203/043; B23K 1/018
(Continued)

(56) References Cited

U.S. PATENT DOCUMENTS

| 3,825,994 A | 7/1974 | Coleman |
| 4,274,576 A * | 6/1981 | Shariff ................ H01L 24/81 228/264 |

(Continued)

FOREIGN PATENT DOCUMENTS

| JP | 01271071 A | * 10/1989 | ............ B23K 1/015 |
| JP | 07246459 A | * 9/1995 | |

OTHER PUBLICATIONS

Solvay, "Galden® PFPE Perfluoropolyether Fluorinated Fluids," Downloaded from the Internet, Dec. 13, 2018. https://www.solvay.com/en/products/brands/galden-pfpe, 2 pgs.

*Primary Examiner* — Kiley S Stoner
(74) *Attorney, Agent, or Firm* — Robert J. Shatto (57) ABSTRACT

Provided is a system for removing an electronic component from a printed circuit board (PCB). The system may comprise a heating well configured to hold a rework liquid. The system may further comprise a head system configured to create a liquid-tight seal around an electronic component. The system may further comprise a nozzle and a mechanical capture device disposed within the head system. The mechanical capture device may be configured to attach to the electronic component. The system may further comprise a controller. The controller may be configured to release the rework liquid through the nozzle and onto the electronic component and lift the electronic component off the PCB.

20 Claims, 6 Drawing Sheets

(52) U.S. Cl.
CPC ............... *H05K 2203/0338* (2013.01); *H05K 2203/043* (2013.01)

(58) Field of Classification Search
USPC .... 229/13, 191, 119, 264; 228/13, 191, 119, 228/264
See application file for complete search history.

(56) References Cited

U.S. PATENT DOCUMENTS

| | | | |
|---|---|---|---|
| 4,334,646 A * | 6/1982 | Campbell | B23K 1/08 228/234.1 |
| 4,569,473 A * | 2/1986 | Guiliano | B23K 1/018 228/264 |
| 4,747,533 A * | 5/1988 | Lipschutz | H01L 24/75 228/264 |
| 4,782,991 A | 11/1988 | Breu | |
| 4,874,124 A | 10/1989 | Johns et al. | |
| 5,263,620 A * | 11/1993 | Hernandez | H05K 13/0486 228/264 |
| 5,381,945 A | 1/1995 | Leicht | |
| 6,220,503 B1 * | 4/2001 | Cox | H01L 24/98 257/E21.511 |
| 6,227,434 B1 * | 5/2001 | Bassi | B23K 1/018 228/264 |
| 6,461,801 B1 | 10/2002 | Wang | |
| 6,502,740 B2 | 1/2003 | Matsudome | |
| 6,503,336 B1 * | 1/2003 | Barr | B23K 1/012 15/345 |
| 6,971,571 B2 | 12/2005 | Nakamura et al. | |
| 2011/0024484 A1 * | 2/2011 | Suihkonen | H05K 13/0486 228/264 |
| 2011/0072655 A1 | 3/2011 | Koyama et al. | |
| 2012/0006803 A1 * | 1/2012 | Bartley | H01L 25/50 219/162 |
| 2017/0223882 A1 * | 8/2017 | Brosseau | B23K 1/018 |
| 2021/0069810 A1 * | 3/2021 | Rehm | B23K 1/008 |

\* cited by examiner

LOCALIZED REWORK USING LIQUID MEDIA SOLDERING

BACKGROUND

The present disclosure relates generally to the field of electronic printed circuit board (PCB) assembly rework, and more particularly to replacing an electronic component on the PCB using liquid media soldering.

Rework is the refinishing operation or repair of an electronic PCB assembly (PCBA), usually involving desoldering and re-soldering of surface-mounted electronic components. A hot air gun or hot air station is used to heat devices and melt solder, and specialized tools are used to pick up and position the often tiny components. Ball grid arrays (BGA) present special difficulties for rework, as they have many small, closely spaced pads on their underside which are connected to matching pads on the PCB. Connecting pins are not accessible directly from the top and cannot be desoldered without heating the whole device to the melting point of the solder.

SUMMARY

Embodiments of the present disclosure include a system for removing an electronic component from a printed circuit board (PCB). The system may comprise a heating well configured to hold a rework liquid. The system may further comprise a head system configured to create a liquid-tight seal around an electronic component. The system may further comprise a nozzle and a mechanical capture device disposed within the head system. The mechanical capture device may be configured to attach to the electronic component. The system may further comprise a controller. The controller may be configured to release the rework liquid through the nozzle and onto the electronic component and lift the electronic component off the PCB.

Further embodiments of the present disclosure include a method, system, and computer program product for removing an electronic component from a printed circuit board (PCB). The method may comprise attaching a top sealing head to a first side of a PCB and a bottom sealing head to a second side of the PCB. The top sealing head may surround an electronic component undergoing rework. The bottom sealing head may be disposed opposite to the top sealing head. The method may further comprise releasing a rework liquid into the top sealing head. The rework liquid may be at a temperature that is higher than the melting point of solder used to attach the electronic component to the PCB. The method may further comprise removing the electronic component from the PCB after the solder has begun melting. The electronic component may be removed using a mechanical capture device disposed inside of the top sealing head.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the field of electronic printed circuit board (PCB) assembly rework, and in particular to replacing an electronic component on the PCB using liquid media soldering. While the present disclosure is not necessarily limited to such applications, various aspects of the disclosure may be appreciated through a discussion of various examples using this context.

Localized rework on large array surface mount technologies (SMT) like ball grid array (BGA) logic devices and SMT connectors is commonly conducted by an isolated hot-air and/or laser IR rework system. Occasionally, reworking large components using hot-air/laser IR rework causes excessive peak temperatures during reflow that are too severe and can cause card damage to either the printed circuit board assembly and/or the component. Also, large thermal gradients can occur and degrade solder joint quality.

To prevent these larger gradients and excessive peak temperatures, some systems utilize local vapor phase reflow. One major issue with vapor phase reflow is that much of the media vapor exits into the exhaust and requires a recovery system to get the media back from the exhaust. The vapor is considered an ozone absorbing material and is regulated by the EPA. Additionally, vapor phase fluid is expensive.

Embodiments of the present disclosure include a system for localized SMT rework using liquid media soldering. The liquid rework media (also referred to herein as the "rework liquid") is heated to a temperature that exceeds the melting point of the solder used on the component being removed, and it is applied through flow restriction nozzles. In some embodiments, the rework liquid is gravity fed through the nozzle(s), thereby reducing the complexity of the system. In other embodiments, one or more pumps may be used to force the rework liquid through the nozzle(s).

The system further includes a rework head system having topside and bottom side sealing heads that seal around the target component (i.e., the component being reworked). The rework head system includes a mechanical capture device that lifts the target component once proper temperatures are achieved. The mechanical capture device may be configured to attach to the target component (e.g., by physically grasping the electronic component). The same sealing heads and liquid reflow technique can be used to re-attach the new component once the PCBA location has seen site dress, solder stenciling, and component placement.

Advantageously, unlike with isolated hot-air and/or laser IR rework system, in some embodiments of the present disclosure, the peak temperature of the rework process will not exceed the temperature of fluid, and, therefore, can be well controlled. This may reduce damage done to solder joints, the PCB, and the components on the PCB, particularly temperature sensitive components. Additionally, embodiments allow for the recapture of rework fluid on both sides of the PCB, reducing waste and environmental impacts. Additionally, unlike some other systems, in some embodiments, the PCB does not have to be held upside down during rework. This reduces disturbances to solder paste deposits from stenciling, and makes it easier to maintain X-Y registration during attachment. Furthermore, previous systems rely on vacuum attachment, which is limited to just BGA-type devices with flat surfaces and would not cover odd shape components and different connectors. However, in embodiments of the present disclosure, other mechanical means for lifting and/or placing components can be used, enabling the system to be used to rework many different types of electronic components.

In some embodiments, the liquid media rework system uses gravity-fed liquid media to heat the PCBA and device to soldering temperatures. Nozzle seals on the top and bottom of the PCBA are used to ensure that the liquid media does not heat up neighboring components, and to ensure that most of the liquid media is recaptured for future use. The nozzle design can be modified to control the flow rate of the liquid media and, therefore, control the thermal profile. A mechanical capture device is built into the nozzle assembly (also referred to herein as a "rework head system" or "rework head") to remove the electronic component from the PCBA. Site dress, solder/flux replenishment, and device placement is performed as per standard area array rework. The liquid media soldering system is then used to reflow the solder and flux on the new electronic component. In some embodiments, a global bottom side preheater may be added to the bottom of the PCBA to aide in thermal profile development.

It is to be understood that the aforementioned advantages are example advantages and should not be construed as limiting. Embodiments of the present disclosure can contain all, some, or none of the aforementioned advantages while remaining within the spirit and scope of the present disclosure.

Figure 1:
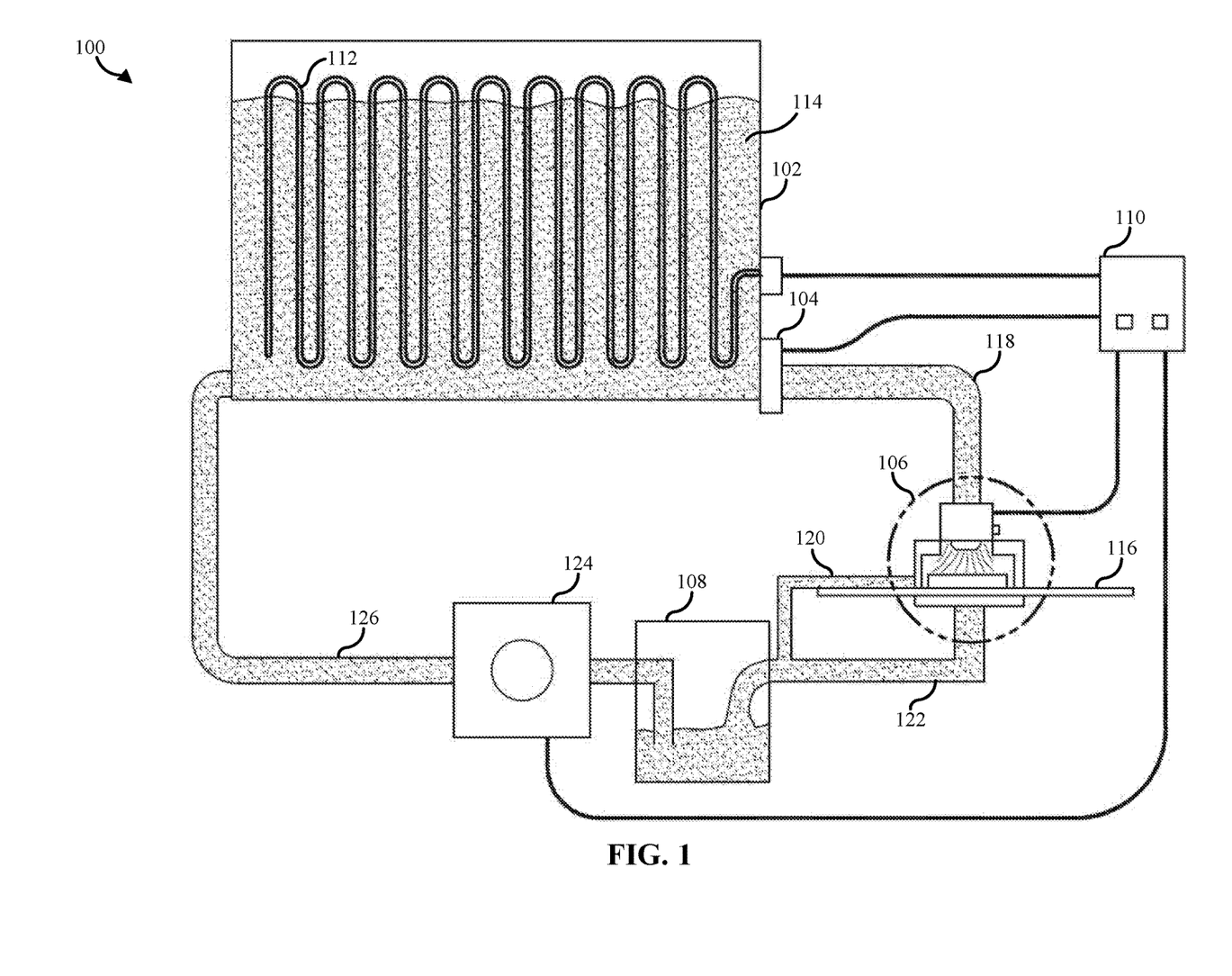
FIG. 1 illustrates an example liquid media rework system, in accordance with embodiments of the present disclosure.

Turning now to the figures, FIG. 1 illustrates an example liquid media rework system 100, in accordance with embodiments of the present disclosure. The system 100 includes a heating well 102, a control valve 104, a rework head 106, a reservoir 108, and a controller 110.

The heating well 102 is configured with heaters 112 (e.g., a heating coil) and a control system to achieve the proper temperature of the rework liquid 114. The control system (not shown) may include one or more sensors to monitor the temperature of the rework liquid 114. In some embodiments, the heating well 102 is placed above the work area (e.g., above the rework head 106 and PCB 116). This allows the system 100 to rely on gravity to force the heated rework liquid 114 through the control valve 104 and outlet pipe 118 and into the rework head 106. As used herein, a component is considered to be "above" a second component if the component has a higher gravitational potential that the second component. In other words, a component is above a second component if gravity causes liquid to flow from the component to the second component. The control valve 104 is configured to control the access of the rework liquid 114 to the sealing heads and flow nozzles in the rework head 106. The control valve 104 may be a programmable solenoid.

The rework liquid 114 may be any liquid with a boiling point that is higher than the melting temperature of the solder on the PCB 116. Embodiments of the present disclosure include selecting a rework liquid 114 based on the characteristics of the fluid. The rework liquid 114 may be selected according to, for example, its boiling point (e.g., should be higher than the melting point of the solder), thermal conductivity (the higher the thermal conductivity, the better the thermal transfer to the solder joints), evaporative qualities (e.g., the more evaporative the liquid, the easier it is to remove residual liquid by baking it off), and/or reactivity with components on a PCB (the less reactive, the less damage that may be done to components on the PCB). In some embodiments, the rework liquid 114 is non-corrosive, does not dissolve solder paste, and leave limited residue.

In general, a liquid media will have superior thermal conductivity than gaseous media. For example, in some embodiments, the system 100 uses Solvay Galden HT270 fluid, which is a perfluoropolyether fluorinated fluid with a boiling point of approximately 270 degrees C., has a thermal conductivity of 0.65 W/(m Deg C). Furthermore, Solvay Galden HT270 can easily evaporate in bake off if there is left over material on the PCB post processing, and has been shown to be inert to solder chemistries and card assembly materials.

The rework head 106 is configured to create a seal around the target component, apply rework liquid 114 onto the target component, remove or replace the target component, and capture excess rework liquid 114. An example rework head 106 is shown and described in more detail in reference to FIG. 2.

The system 100 contains two drain lines: a top drain line 120 connected to a top sealing head and a bottom drain line 122 connected to a bottom sealing head. The drain lines 120, 122 are configured to collect the rework liquid 114 from the top and bottom of the PCB 116, and drain the rework liquid 114 into a reservoir 108. This allows the rework liquid 114 to be recycled and used in future rework processes.

In some embodiments, the reservoir 108 may include, or act as, a filtration system (not shown) to filter the rework liquid 114 and remove any solder material that has contaminated the rework liquid 114. Additionally, the system 100 may include a pump 124 to pull the rework liquid 114 from the reservoir 108 and send it through an inlet pipe 126 back into the heating well 102. In some embodiments, a separate filtration system may be disposed between the reservoir 108 and the pump 124. The filtration system may filter the rework liquid 114 prior to the rework liquid 114 entering the pump 124. Though advantageous, it is not required to have a pump 124 to pull the liquid media from the reservoir 108 back into the heating well 102 and/or a filtration system to filter the liquid media. In some embodiments, the reservoir 108 can be emptied manually to the heating well.

The controller 110 is configured to control the various other components in the system 100. For example, the controller 110 may send control signals to the pump(s), include the pump 124, to cause the pumps to activate.

Similarly, the controller 110 may control the rework head 106, including the mechanical capture device 208 and motor 210, as well as the control valve 104, and the heaters 112. Additionally, the controller 110 may monitor the system 100 (e.g., the temperature of the rework liquid 114) using a plurality of sensors (not shown) and make adjustments to control the rework processes. Furthermore, the controller 110 may be configured to effectuate the rework processes disclosed herein, including the methods 400 and 500.

Figure 2:
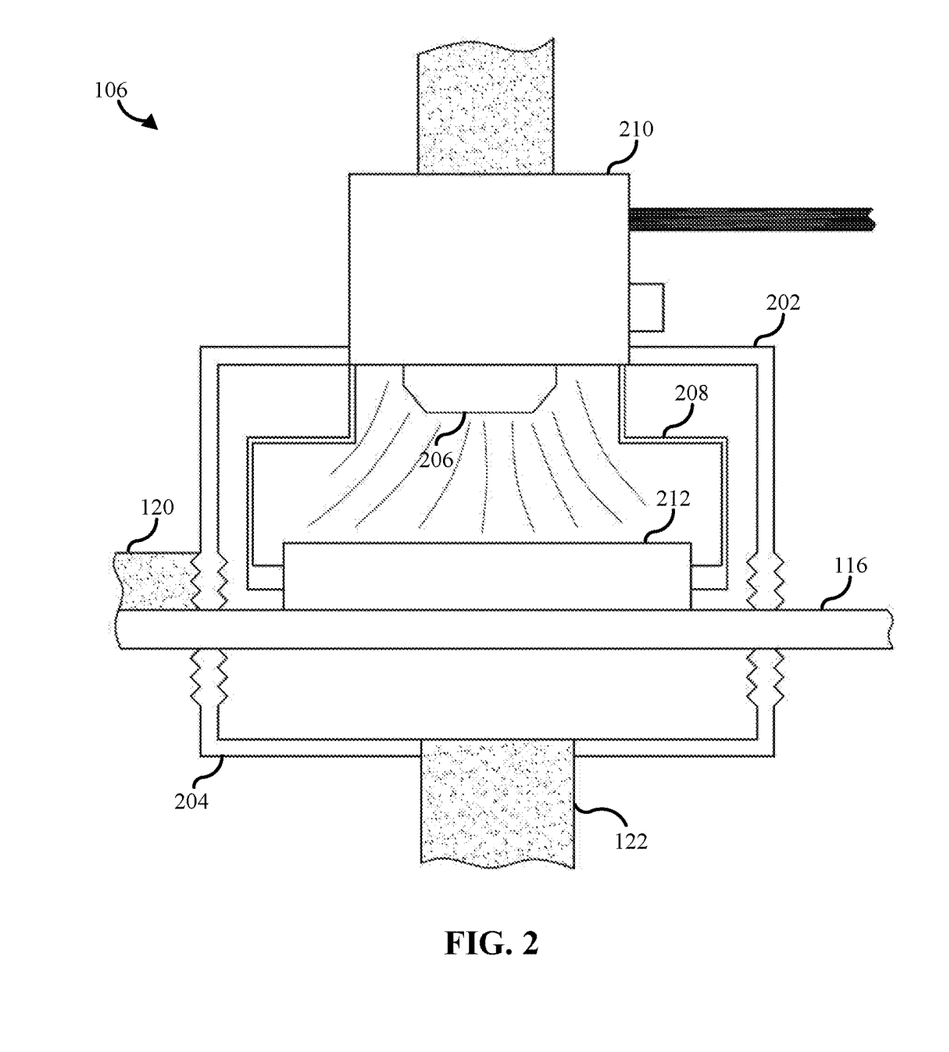
FIG. 2 illustrates an example rework head system, in accordance with embodiments of the present disclosure.

Referring now to FIG. 2, illustrated is an example rework head 106, in accordance with embodiments of the present disclosure. The rework head 106 is configured to apply a rework liquid onto the PCB 116 and remove/replace an electronic component 212 on the PCB 116. Within the rework head 106 is a nozzle 206 and a mechanical capture device 208 to engage the component 212 to be reworked.

This rework head 106 seals the top and bottom of the PCB 116 and is designed with drainage features (e.g., top drain line 120 and bottom drain line 122) for the hot liquid to exit into the lower piping and reservoir. The rework head 106 uses a top sealing head 202 and a bottom sealing head 204 to seal off the component 212. The top and bottom sealing heads 202, 204 are configured to surround the component being reworked 212 and to create a liquid-tight seal with the PCB 116. The bottom sealing head 204 is disposed opposite the top sealing head 202 (e.g., lined up with each other on opposite sides of the PCB 116) to capture any fluids that drain through the PCB 116. Rework liquid can then be pumped through the space created by the top sealing head 202 to cause the solder material to reflow (e.g., to remove a component or to place a new component). The top and bottom sealing heads 202, 204 have draining ports that allow the rework liquid to drain into the reservoir. Embodiments of the present disclosure have sealing heads on the topside and bottom side of the PCB 116 to account for fluid flow through the vias and/or plated through holes (PTHs).

The mechanical capture device 208 is a device capable of holding on to the electronic component 212 and providing a mechanical force to lift the component 212 off the PCB 116 once the solder has been melted. Additionally, the mechanical capture device 208 may be used to hold a new component in place during the replacement process (e.g., during the solder reflow process). The mechanical capture device 208 may be configured to grab, clip onto, screw in to, or otherwise mechanically attach to the electronic component 212. The mechanical capture device 208 may be actuated by a motor 210.

Figure 3:
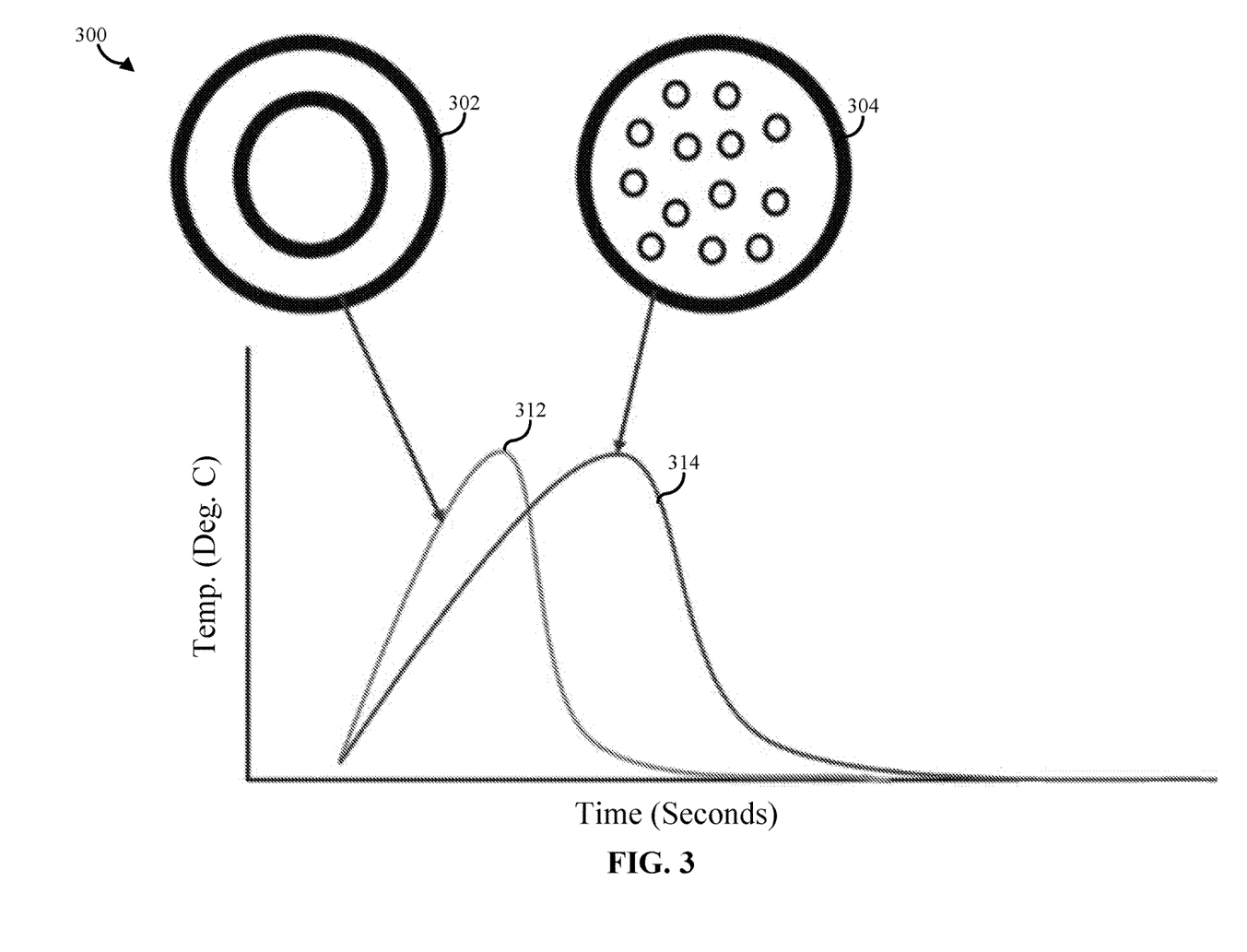
FIG. 3 is a graph illustrating the effect of nozzle geometry on the thermal profile of the component being reworked, in accordance with embodiments of the present disclosure.

The mechanical actuation of the head 106 and mechanical capture device 208 are controlled by the rework station control system (e.g., a controller). Characteristics of the nozzle design (e.g., size, configuration, and number of openings) can be adjusted to control the rate of heating and thus control the thermal profile. FIG. 3 illustrates heating profiles for two example nozzles.

Referring now to FIG. 3, shown is a graph 300 illustrating the effect of nozzle geometry on the thermal profile of the component being reworked, in accordance with embodiments of the present disclosure. The graph shows two heating profiles for two different nozzles: a first heating profile 312 for a first nozzle 302, and a second heating profile 314 for a second nozzle 304. A large opening flow nozzle, such as the first nozzle 302, will allow faster heating up thermal profiles. Meanwhiles, nozzles that provide a showering/rain stream, such as the second nozzle 304, will provide a slow process.

Figure 4:
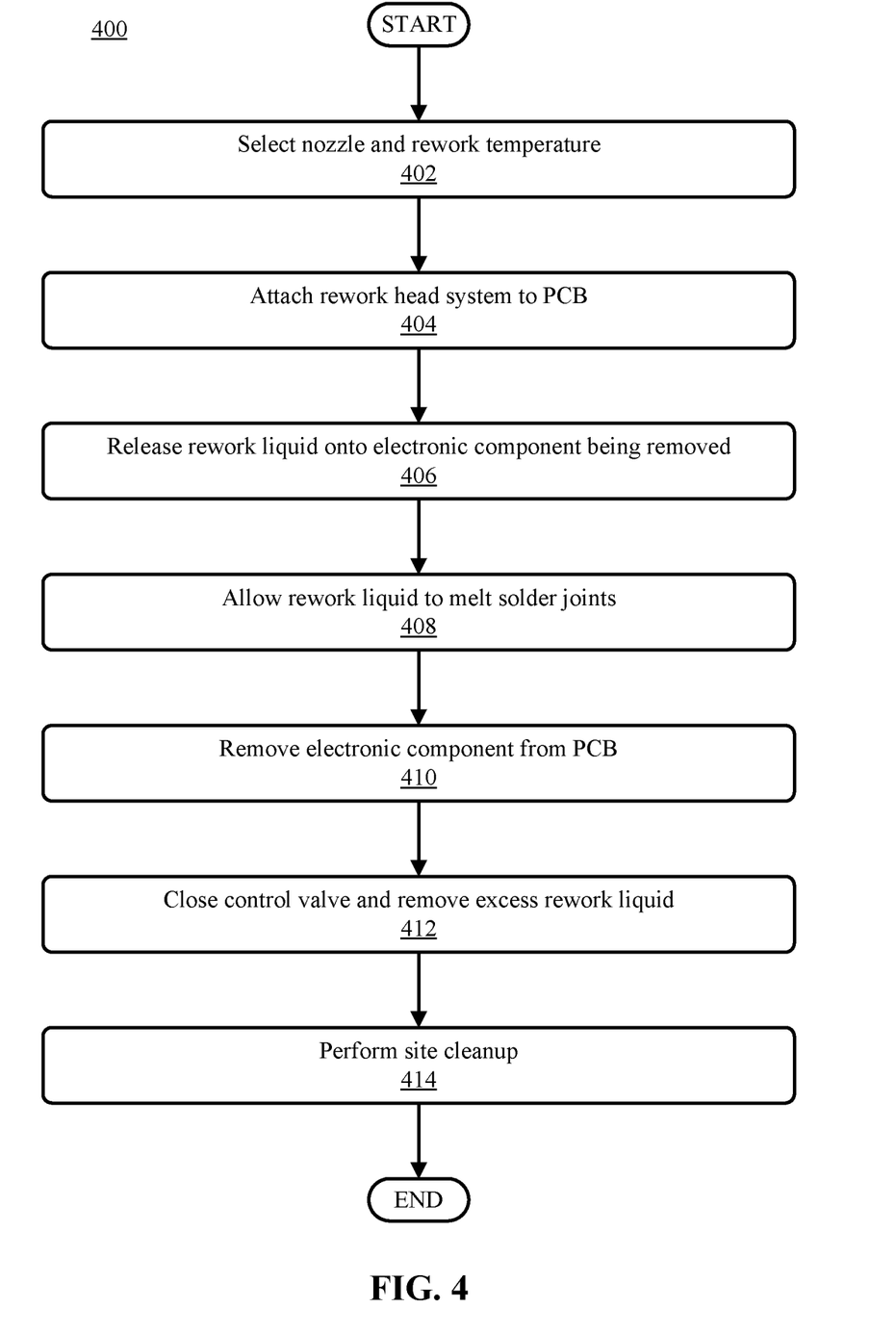
FIG. 4 illustrates a flowchart of an example method for removing an electronic component from a PCB using a liquid rework media, in accordance with embodiments of the present disclosure.

Referring now to FIG. 4, illustrated is a flowchart of an example method 400 for removing an electronic component from a PCB using a liquid rework media, in accordance with embodiments of the present disclosure. In some embodiments, the method 400 may be part of an automated (or semi-automated) rework process. For example, one or more operations of the method 400 may be performed by hardware, firmware, software executing on a processor (e.g., a controller), or any combination thereof. The method 400, when performed by a processor, may include sending one or more control signals to one or more other devices (e.g., motors, solenoids, actuators, etc.), causing the one or more other devices to perform an action. The method 400 may begin at operation 402, wherein the nozzle and rework temperature are selected.

The rework temperature may be selected based on, for example, the solder material (e.g., the chemical composition of the solder) used to attach the electronic component to the PCB. For example, if the solder material has a melting point of 170° C., the rework temperature may be selected as a temperature above 170° C. In some embodiments, the rework temperature may also be based on the component being removed and/or the characteristics of the rework liquid (e.g., its boiling point, its temperature-dependent thermal conductivity, etc.). For example, if the component being removed is a temperature sensitive component, a lower rework temperature may be used than when removing a component that is not temperature sensitive or when removing a component that is not going to be reused, so damaging the component is acceptable.

In some embodiments, the rework liquid may be heated to the selected rework temperature. This may be performed by the processor controlling a heating unit inside of a heating well that contains the rework liquid. Temperature sensors in the heating well may send temperature data back to the processor, which may monitor the temperature of the rework liquid and control the heating unit to maintain the appropriate temperature.

The nozzle may be selected based on the desired temperature profile (e.g., rate at which the temperature changes). For lower temperature increase rates, nozzles with multiple holes to create a showering effect may be utilized. Meanwhile, more aggressive temperature increase rates may require nozzles with fewer, larger holes to increase the rate at which rework liquid is dispensed onto the component.

At operation 404, the rework head system is attached to the PCB. The rework head system may be attached using top and bottom sealing heads. A mechanical force may be applied (e.g., by a motor controlled by a processor/controller) to create a liquid-tight seal around the electronic component. The rework head system may be controlled by the processor. For example, the processor may control one or more motors or actuators to position the top and bottom sealing heads and to attach the top and bottom sealing heads to the PCB.

At operation 406, rework liquid is released into the rework head system and onto the electronic component using a nozzle. The rework liquid may be released by a processor sending a control signal to a control valve, causing the control valve to open and release the rework liquid from a heating well. In embodiments that utilize a pump to force the rework fluid through the nozzle, the processor may also control the pump to release the rework liquid and to control the pressure at the nozzle.

At operation 408, the rework liquid is allowed to continue flowing on to the PCB until the solder joints are melted. The amount of time that the rework liquid is allowed to flow may be based on, for example, the temperature of the rework liquid, the thermal characteristics (e.g., conductivity) of the rework liquid, the nozzle geometry, and/or the solder material. In addition, backside heating may be applied to the PCB to help control the heating profile. Sensors in the rework head system, such as temperature sensors, may be used to gauge the temperature of the PCB and determine when the solder joints have melted.

At operation 410, the electronic component may be removed from the PCB. A mechanical capture device inside the rework head system may be used to apply a force to the electronic component, lifting the electronic component from the PCB.

At operation 412, the control valve may be closed, stopping the flow of rework liquid into the rework head system. The remaining rework liquid in the outlet pipe and rework head system may be allowed to drain into a reservoir.

At operation 414, the site may be cleaned up. In some embodiments, cleaning up the site of the electronic component may include removing any residual rework liquid (e.g., by baking it off), cleaning the site, and preparing it for a new electronic component (e.g., apply new solder paste). After cleaning up the site at operation 414, the method 400 may end.

Figure 5:
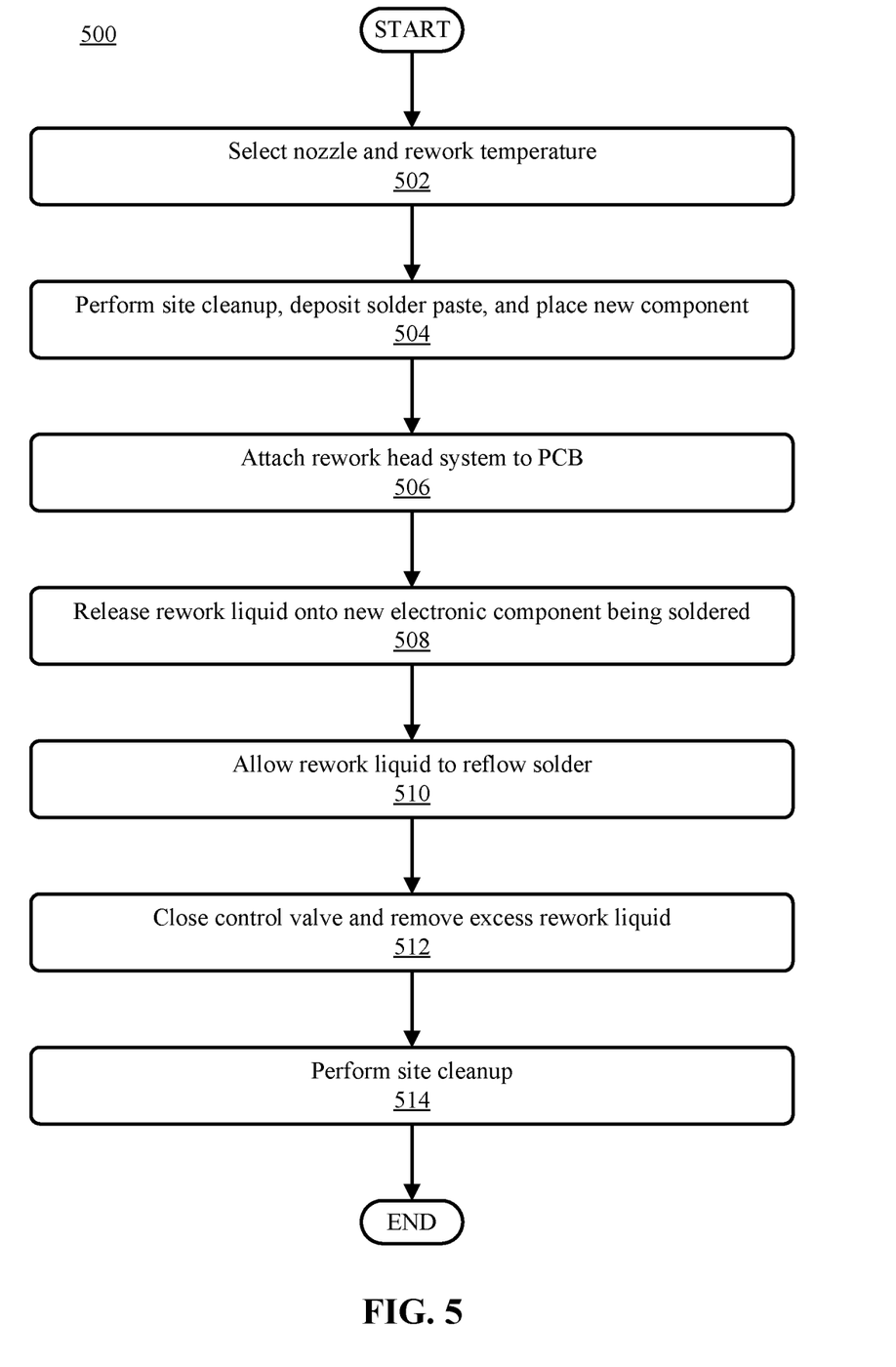
FIG. 5 illustrates a flowchart of an example method for soldering an electronic component to a PCB using a liquid rework media, in accordance with embodiments of the present disclosure.

Referring now to FIG. 5, illustrated is a flowchart of an example method 500 for soldering an electronic component to a PCB using a liquid rework media, in accordance with embodiments of the present disclosure. In some embodiments, the method 500 may be part of an automated (or semi-automated) rework process. For example, one or more operations of the method 500 may be performed by hardware, firmware, software executing on a processor (e.g., a controller), or any combination thereof. The method 500, when performed by a processor, may include sending one or more control signals to one or more other devices (e.g., motors, solenoids, actuators, etc.), causing the one or more other devices to perform an action. The method 500 may begin at operation 502, wherein the nozzle and rework temperature may be selected.

Operation 502 may be the same as, or substantially similar to, operation 402, and the factors considered may be the same as described with respect to operation 402. However, the rework temperature used to reflow the solder paste and attach a new component may generally be higher than the temperature to remove a component. Additionally, the flow pressure of the nozzle may be different. For example, a slower flow may be desired when attaching a new component to reduce the likelihood that the flowing rework liquid will displace the component or remove solder material.

At operation 504, the location of the new component may be cleaned up, new solder may be deposited, and the new electronic component may be placed over the new solder. After the new component is placed, the rework head system may be attached to the PCB at operation 506. As described herein, the rework head system may be attached to create a liquid-tight seal with the PCB. Additionally, the mechanical capture device may be attached to the new electronic component. The mechanical capture device may be used to hold the new electronic component in place during the reflow operation.

At operation 508, rework liquid is released into the rework head system and onto the electronic component using a nozzle. The rework liquid may be released by a processor sending a control signal to a control valve, causing the control valve to open and release the rework liquid from a heating well. In embodiments that utilize a pump to force the rework fluid through the nozzle, the processor may also control the pump to release the rework liquid and to control the pressure at the nozzle.

At operation 510, the rework liquid is allowed to continue flowing on to the PCB until the solder reflows. The amount of time that the rework liquid is allowed to flow may be based on, for example, the temperature of the rework liquid, the thermal characteristics (e.g., conductivity) of the rework liquid, the nozzle geometry, and/or the solder material. In addition, backside heating may be applied to the PCB to help control the heating profile. Sensors in the rework head system, such as temperature sensors, may be used to gauge the temperature of the PCB and determine when the solder has begun reflowing.

At operation 512, the control valve may be closed, stopping the flow of rework liquid into the rework head system. The remaining rework liquid in the outlet pipe and rework head system may be allowed to drain into a reservoir.

At operation 514, the site may be cleaned up. In some embodiments, cleaning up the site may include removing any residual rework liquid (e.g., by baking it off). After cleaning up the site at operation 514, the method 500 may end.

Figure 6:
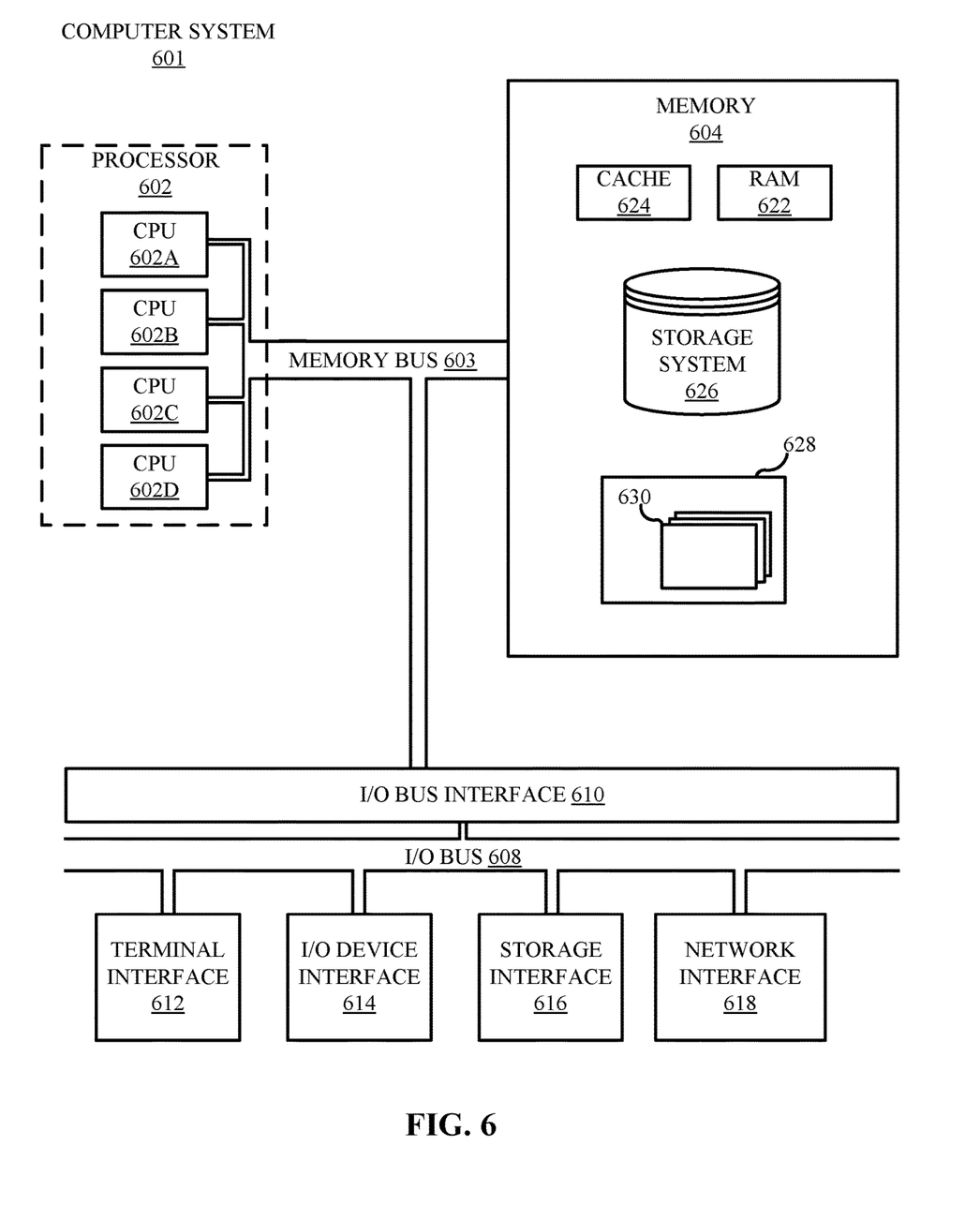
FIG. 6 illustrates a high-level block diagram of an example computer system that may be used in implementing one or more of the methods, tools, and modules, and any related functions, described herein, in accordance with embodiments of the present disclosure.

Referring now to FIG. 6, shown is a high-level block diagram of an example computer system 601 that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Program modules 630 generally perform the functions or methodologies of various embodiments.

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary. Furthermore, the modules are listed and described illustratively according to an embodiment and are not meant to indicate necessity of a particular module or exclusivity of other potential modules (or functions/purposes as applied to a specific module).

In addition to embodiments described above, other embodiments having fewer operational steps, more operational steps, or different operational steps are contemplated. Also, some embodiments may perform some or all of the above operational steps in a different order. Furthermore, multiple operations may occur at the same time or as an internal part of a larger process. The modules are listed and described illustratively according to an embodiment and are not meant to indicate necessity of a particular module or exclusivity of other potential modules (or functions/purposes as applied to a specific module).

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., $100a$, $100b$, $100c$) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A system for performing rework of a printed circuit board (PCB), the system comprising:
a heating well configured to hold a rework liquid;
a head system configured to create a liquid-tight seal around an electronic component, wherein the head system comprises:
a top sealing head configured to attach to the top of the PCB and surround the electronic component; and
a bottom sealing head configured to attach to the bottom of the PCB opposite the top sealing head,
wherein the top and bottom sealing heads do not entirely enclose the PCB;
a nozzle and a mechanical capture device disposed inside of the head system, the mechanical capture device being configured to attach to the electronic component; and
a controller configured to perform a method comprising:
releasing the rework liquid through the nozzle and onto the electronic component; and
lifting the electronic component off the PCB.

2. The system of claim 1, the system further comprising:
a reservoir attached to the head system via two or more drain lines, the two or more drain lines including a first drain line attached to the top sealing head and a bottom drain line attached to the bottom sealing head, wherein the reservoir is disposed below the head system.

3. The system of claim 2, the system further comprising:
a pump disposed between the reservoir and the heating well, wherein the pump is configured to pump fluid out of the reservoir and into the heating well; and
a filtration system disposed between the pump and the reservoir, wherein the filtration system is configured to filter the rework liquid prior to the rework liquid entering the pump.

4. The system of claim 1, wherein the heating well is above the head system such that gravitational forces force the rework liquid out of the heating well, through an outlet pipe, and into the head system.

5. The system of claim 1, the system further comprising:
a pump coupled to an outlet of the heating well and to the head system such that the rework liquid flows out of the heating well, through the pump, and into the head system, the pump being connected to and controlled by the controller.

6. The system of claim 1, wherein lifting the electronic component off the PCB comprises sending, by the controller, a control signal to a motor attached to the mechanical capture device, wherein the control signal is configured to cause the mechanical capture device to:
physically grasp the electronic component; and
apply a force to the electronic component causing the electronic component to separate from the PCB.

7. A method for performing a rework operation on an electronic component, the method comprising:
attaching a top sealing head to a top surface of a printed circuit board (PCB), wherein the top sealing head surrounds an electronic component being reworked and creates a liquid-tight seal with the top surface of the PCB;
attaching a bottom sealing head to a bottom surface of the PCB, wherein the bottom sealing head is disposed opposite to the top sealing head, the bottom sealing head creating a liquid-tight seal with the bottom surface of the PCB;
releasing a rework liquid into the top sealing head, wherein the rework liquid is at a temperature that is higher than a melting point of solder used to attach the electronic component to the PCB; and
removing, after the solder has begun melting, the electronic component from the PCB using a mechanical capture device disposed inside of the top sealing head.

8. The method of claim 7, wherein releasing the rework liquid comprises sending, by a processor, a control signal to a control valve disposed between the top sealing head and a heating well that contains the rework liquid, wherein the control signal causes the control valve to open.

9. The method of claim 8, the method further comprising:
sending, by the processor, after removing the electronic component from the PCB, a second control signal to the control valve, wherein the second control signal causes the control valve to close.

10. The method of claim 7, the method further comprising:
selecting a rework temperature for the rework liquid; and
heating the rework liquid to the rework temperature using one or more heating devices disposed within a heating well that includes the rework liquid.

11. The method of claim 10, wherein the rework temperature is selected by a processor based on a chemical composition of the solder.

12. The method of claim 7, the method further comprising:
cleaning, after removing the electronic component from the PCB, a site where the electronic component was previously attached to the PCB;
depositing new solder at the site;
positioning a new electronic component at the site; and
releasing the rework liquid onto the electronic component to cause reflow of the new solder and to solder the new electronic component to the PCB.

13. The method of claim 7, wherein removing the electronic component from the PCB comprises sending, by a processor, a control signal to the mechanical capture device, wherein the control signal is configured to cause the mechanical capture device to:
physically connect to the electronic component by screwing into the electronic component; and
apply a force to the electronic component causing the electronic component to separate from the PCB.

14. A computer program product comprising a computer readable storage medium having program instructions embodied therewith, the program instructions executable by processor to cause the processor to perform a method comprising:
attaching a top sealing head to a top surface of a printed circuit board (PCB), wherein the top sealing head surrounds an electronic component being reworked and creates a liquid-tight seal with the top surface of the PCB;
attaching a bottom sealing head to a bottom surface of the PCB, wherein the bottom sealing head is disposed opposite to the top sealing head, the bottom sealing head creating a liquid-tight seal with the bottom surface of the PCB;

releasing a rework liquid into the top sealing head, wherein the rework liquid is at a temperature that is higher than a melting point of solder used to attach the electronic component to the PCB; and removing, after the solder has begun melting, the electronic component from the PCB using a mechanical capture device disposed inside of the top sealing head.

15. The computer program product of claim 14, wherein releasing the rework liquid comprises sending a control signal to a control valve disposed between the top sealing head and a heating well that contains the rework liquid, wherein the control signal causes the control valve to open.

16. The computer program product of claim 15, wherein the method further comprises:

sending, after removing the electronic component from the PCB, a second control signal to the control valve, wherein the second control signal causes the control valve to close.

17. The computer program product of claim 14, wherein the method further comprises:

selecting a rework temperature for the rework liquid; and heating the rework liquid to the rework temperature using one or more heating devices disposed within a heating well that includes the rework liquid.

18. The computer program product of claim 17, wherein the rework temperature is selected based on a chemical composition of the solder.

19. The computer program product of claim 14, wherein the method further comprises:

cleaning, after removing the electronic component from the PCB, a site where the electronic component was previously attached to the PCB;

depositing new solder at the site;

positioning a new electronic component at the site; and releasing the rework liquid onto the electronic component to cause reflow of the new solder and to solder the new electronic component to the PCB.

20. The method of claim 7, wherein removing the electronic component from the PCB comprises sending, by a processor, a control signal to the mechanical capture device, wherein the control signal is configured to cause the mechanical capture device to:

physically connect to the electronic component by clipping onto the electronic component; and apply a force to the electronic component causing the electronic component to separate from the PCB.

* * * * *